(12) United States Patent
Akita et al.

(10) Patent No.: US 9,973,211 B1
(45) Date of Patent: May 15, 2018

(54) SIGNAL CONVERSION DEVICE

(71) Applicant: KABUSHIKI KAISHA TOSHIBA, Tokyo (JP)

(72) Inventors: Koji Akita, Kanagawa (JP); Yukako Tsutsumi, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days. days.

(21) Appl. No.: 15/691,467

(22) Filed: Aug. 30, 2017

(30) Foreign Application Priority Data

Feb. 16, 2017 (JP) .................................. 2017-026898

(51) Int. Cl.
*H03M 9/00* (2006.01)
*H03L 7/00* (2006.01)

(52) U.S. Cl.
CPC ................ *H03M 9/00* (2013.01); *H03L 7/00* (2013.01)

(58) Field of Classification Search
None
See application file for complete search history.

(56) References Cited

U.S. PATENT DOCUMENTS

| | | | | |
|---|---|---|---|---|
| 7,183,797 B2* | 2/2007 | Venkata | ................ | G06F 13/385 326/38 |
| 7,613,213 B2* | 11/2009 | Yadav | ....................... | H04J 3/04 370/539 |
| 7,659,838 B2* | 2/2010 | Nguyen | .................. | H03M 9/00 341/100 |
| 2006/0222017 A1 | 10/2006 | Quiroga et al. | | |
| 2015/0351057 A1 | 12/2015 | Akita et al. | | |
| 2016/0337556 A1 | 11/2016 | Akita et al. | | |

FOREIGN PATENT DOCUMENTS

| | | |
|---|---|---|
| JP | 2008-535085 | 8/2008 |
| JP | 2015-226214 | 12/2015 |
| JP | 2016-213742 | 12/2016 |

\* cited by examiner

*Primary Examiner* — Howard Williams
(74) *Attorney, Agent, or Firm* — Finnegan, Henderson, Farabow, Garrett & Dunner, L.L.P.

(57) ABSTRACT

According to one embodiment, a signal conversion device includes a first serial-parallel converter, a second serial-parallel converter, a first buffer, a second buffer, a clock generator, and a selection output part. The first serial-parallel converter receives a first serial signal, generates a first clock signal I, generates a first parallel signal, and generates first status information including first information. The second serial-parallel converter receives a second serial signal, generates a second clock signal, generates a second parallel signal, and generates second status information including second information. The first buffer stores the first parallel signal. The second buffer stores the second parallel signal. The clock generator generates an output clock signal. The selection output part uses the first status information and the second status information to output a signal based on one parallel signal of the first parallel signal or the second parallel signal.

17 Claims, 8 Drawing Sheets

SIGNAL CONVERSION DEVICE

CROSS-REFERENCE TO RELATED APPLICATIONS

This application is based upon and claims the benefit of priority from Japanese Patent Application No.2017-026898, filed on Feb. 16, 2017; the entire contents of which are incorporated herein by reference.

Field

Embodiments described herein relate generally to a signal conversion device.

Background

For example, a signal conversion device that reciprocally converts serial signals and parallel signals is used in a communication device, etc. A signal conversion device is desirable in which more stable communication is possible.

DETAILED DESCRIPTION

Figure 1:
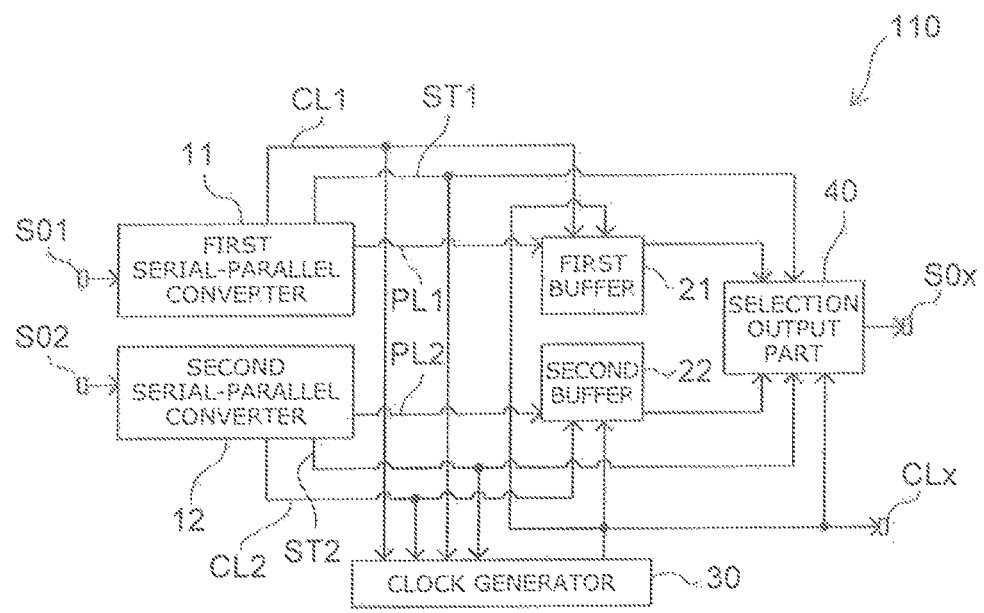
FIG. 1 is a schematic view illustrating a signal conversion device according to a first embodiment.

According to one embodiment, a signal conversion device includes a first serial-parallel converter, a second serial-parallel converter, a first buffer, a second buffer, a clock generator, and a selection output part. The first serial-parallel converter receives a first serial signal, generates a first clock signal synchronized with the first serial signal, generates a first parallel signal by parallelizing the first serial signal, and generates first status information including first information relating to at least one of the first clock signal or the first parallel signal. The second serial-parallel converter receives a second serial signal, generates a second clock signal synchronized with the second serial signal, generates a second parallel signal by parallelizing the second serial signal, and generates second status information including second information relating to at least one of the second clock signal or the second parallel signal. The first buffer stores the first parallel signal. The second buffer stores the second parallel signal. The clock generator generates an output clock signal by using the first clock signal, the second clock signal, the first status information, and the second status information. The selection output part uses the first status information and the second status information to output, as an output parallel signal synchronized with the output clock signal, a signal based on one parallel signal of the first parallel signal stored in the first buffer or the second parallel signal stored in the second buffer.

According to another embodiment, a signal conversion device includes a first serial-parallel converter, a second serial-parallel converter, a first buffer, a second buffer, a clock generator, and a selection output part. The first serial-parallel converter receives a first serial signal, generates a first clock signal synchronized with the first serial signal, generates a first parallel signal by parallelizing the first serial signal, and generates first status information including first information relating to at least one of the first clock signal or the first parallel signal. The second serial-parallel converter receives a second serial signal, generates a second clock signal synchronized with the second serial signal, generates a second parallel signal by parallelizing the second serial signal, and generates second status information including second information relating to at least one of the second clock signal or the second parallel signal. The first buffer stores the first parallel signal. The second buffer stores the second parallel signal. The clock generator generates an output clock signal by using the first clock signal, the second clock signal, the first status information, and the second status information. The selection output part uses the first status information and the second status information to output, as an output parallel signal synchronized with the output clock signal, a signal based on one selected from the first parallel signal stored in the first buffer and the second parallel signal stored in the second buffer.

Various embodiments will be described hereinafter with reference to the accompanying drawings.

The drawings are schematic and conceptual; and the relationships between the thickness and width of portions, the proportions of sizes among portions, etc., are not necessarily the same as the actual values thereof. Further, the dimensions and proportions may be illustrated differently among drawings, even for identical portions.

In the specification and drawings, components similar to those described or illustrated in a drawing thereinabove are marked with like reference numerals, and a detailed description is omitted as appropriate.

First Embodiment

FIG. 1 is a schematic view illustrating a signal conversion device according to a first embodiment.

As shown in FIG. 1, the signal conversion device 110 according to the first embodiment includes a first serial-parallel converter 11, a second serial-parallel converter 12, a first buffer 21, a second buffer 22, a clock generator 30, and a selection output part 40.

At least two of these components may be provided in separate circuits (including semiconductor devices). Or, at least two of these components may be provided in one circuit (including a semiconductor device). These components may be functionally-separated parts.

For example, the first serial-parallel converter 11 receives a first serial signal S01. The first serial-parallel converter 11 generates a first clock signal CL1, a first parallel signal PL1, and first status information ST1. The first clock signal CL1 is synchronous with the first serial signal S01. The first parallel signal PL1 is a signal generated by parallelizing the first serial signal S01. The first status information ST1 includes first information relating to at least one of the first clock signal CL1 or the first parallel signal PL1. The first information includes, for example, information relating to whether the first clock signal CL1 is valid or invalid. The first information includes, for example, information relating to whether the first parallel signal PL1 is valid or invalid.

The first clock signal CL1, the first parallel signal PL1, and the first status information ST1 are supplied to the first buffer 21. The first clock signal CL1 and the first status information ST1 are supplied to the clock generator 30. The first status information ST1 is supplied to the selection output part 40.

For example, the second serial-parallel converter 12 receives a second serial signal S02. The second serial-parallel converter 12 generates a second clock signal CL2, a second parallel signal PL2, and second status information ST2. The second clock signal CL2 is synchronous with the second serial signal S02. The second parallel signal PL2 is a signal generated by parallelizing the second serial signal S02. The second status information ST2 includes second information relating to at least one of the second clock signal CL2 or the second parallel signal PL2. The second information includes, for example, information relating to whether the second clock signal CL2 is valid or invalid. The second information includes, for example, information relating to whether the second parallel signal PL2 is valid or invalid.

The second clock signal CL2, the second parallel signal PL2, and the second status information ST2 are supplied to the second buffer 22. The second clock signal CL2 and the second status information ST2 are supplied to the clock generator 30. The second status information ST2 is supplied to the selection output part 40.

The second serial signal S02 may be, for example, substantially the same as the first serial signal S01.

The first buffer 21 stores the first parallel signal PL1.

The second buffer 22 stores the second parallel signal PL2.

The clock generator 30 generates an output clock signal CLx by using the first clock signal CL1, the second clock signal CL2, the first status information ST1, and the second status information ST2.

The selection output part 40 uses the first status information ST1 and the second status information ST2 to output, as an output parallel signal S0x synchronized with the output clock signal CLx, a signal based on "one parallel signal" of the first parallel signal PL1 stored in the first buffer 21 or the second parallel signal PL2 stored in the second buffer 22. For example, the "one parallel signal" is selected from the first parallel signal PL1 stored in the first buffer 21 and the second parallel signal PL2 stored in the second buffer 22.

For example, the "one parallel signal" recited above is the second parallel signal PL2 stored in the second buffer 22 when the first information includes information that at least one of the first clock signal CL1 or the first parallel signal PL1 is invalid. The second parallel signal PL2 that is stored in the second buffer 22 is a valid signal. In other words, at this time, the selection output part 40 outputs, as the output parallel signal S0x, a signal based on the second parallel signal PL2 stored in the second buffer 22.

On the other hand, for example, the "one parallel signal" recited above is the first parallel signal PL1 stored in the first buffer 21 when the second information includes information that at least one of the second clock signal CL2 or the second parallel signal PL2 is invalid. The first parallel signal PL1 stored in the first buffer 21 is a valid signal. In other words, at this time, the selection output part 40 outputs, as the output parallel signal S0x, a signal based on the first parallel signal PL1 stored in the first buffer 21.

Such a signal conversion device 110 is, for example, a signal multiplexer. For example, even in the case where one of the serial-parallel converters of multiple systems (in the example, two systems) can no longer output a valid parallel signal, the output of the valid parallel signal can be continued. Thereby, the occurrence of burst errors can be suppressed. For example, the occurrence probability of communication errors is reduced. Thereby, a signal conversion device can be provided in which stable communication is possible.

Examples of the status information will now be described.

Figure 2:
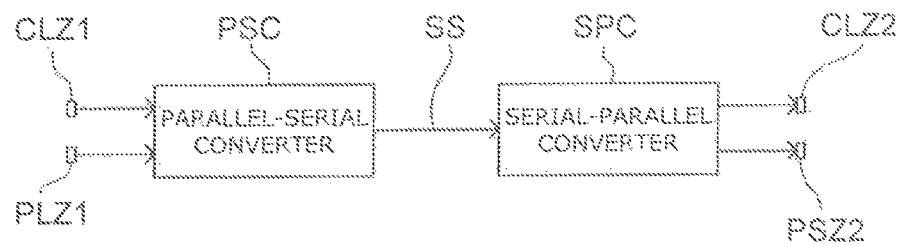
FIG. 2 is a schematic view illustrating the status information of the signal conversion device.

FIG. 2 is a schematic view illustrating the status information of the signal conversion device.

As shown in FIG. 2, a clock signal CLZ1 and a parallel signal PLZ1 are supplied to a parallel-serial converter PSC. In the parallel-serial converter PSC, the clock signal CLZ1 and the parallel signal PLZ1 are multiplexed; and a serial signal SS is generated. The serial signal SS that is generated is received by a serial-parallel converter SPC; a clock signal CLZ2 that corresponds to the original clock signal CLZ1 can be reconstructed; and a parallel signal PLZ2 that corresponds to the original parallel signal PLZ1 can be reconstructed.

There are cases where an external disturbance (e.g., noise, interference, etc.) affects the transmission of the serial signal SS recited above. Thereby, the signal quality degrades. For example, there are cases where it is difficult to reconstruct the clock signal CLZ2 or the parallel signal PLZ2 from the serial signal SS.

When generating the serial signal SS by multiplexing the parallel signal PLZ1 and the clock signal CLZ1, for example, there is a method for adding redundant information that is not included in the parallel signal PLZ1. Thereby, the reconstruction of the clock signal CLZ2 and the parallel signal PLZ2 from the serial signal SS can be easy.

For example, the bit count is increased by adding one or more redundant bits to a parallel signal of a prescribed width (a prescribed length). Also, there is a method for converting into the serial signal SS after increasing the bit count. For example, "8B10B conversion" or the like is used. For example, a parallel signal that has some width is replaced according to some specific rule to have a higher bit width than the parallel signal. The signal is converted into a serial signal after the replacement. By providing the redundant information, the original clock signal and the original parallel signal can be reconstructed in the serial-parallel converter. It is also possible to determine whether or not the reconstruction is performed correctly. For example, in the case where a redundant bit is added, there is a possibility that the reconstruction is not performed correctly if the redundant bit is different from the original value. In the case where a conversion such as "8B10B conversion" or the like is used, there is a possibility that the reconstruction is not performed correctly if the reconstructed signal has a bit pattern that cannot be generated according to some specific rule. Thus, it can be detected that the parallel signal is not reconstructed correctly. In other words, it is possible to detect that the parallel signal is invalid.

Broadly speaking, two reasons are considered to cause the state in which the parallel signal is abnormal. One reason is that an error occurs in a bit of a portion of the serial signal. The other reason is that the quality of the reconstructed clock degrades, and the parallel signal cannot be reproduced correctly from the serial signal. In the case where the parallel signal is abnormal, there is a possibility that the clock signal also is abnormal.

In the case where the condition occurs in the serial-parallel conversion in which the parallel signal is abnormal, there is a possibility that at least one of the reconstructed parallel signal or the reconstructed clock signal is abnormal. The status information (the first status information ST1, the second status information ST2, etc.) includes the information that there is such a possibility of being abnormal. The status information is output to notify that there is a possibility of being abnormal. In the case where validity is indicated by the status information, the clock signal and the parallel signal that are output from the serial-parallel converter are valid. On the other hand, in the case where invalidity is indicated by the status information, at least one of the clock signal or the parallel signal is invalid.

An example of operations of the signal conversion device 110 according to the first embodiment will now be described.

Figure 3:
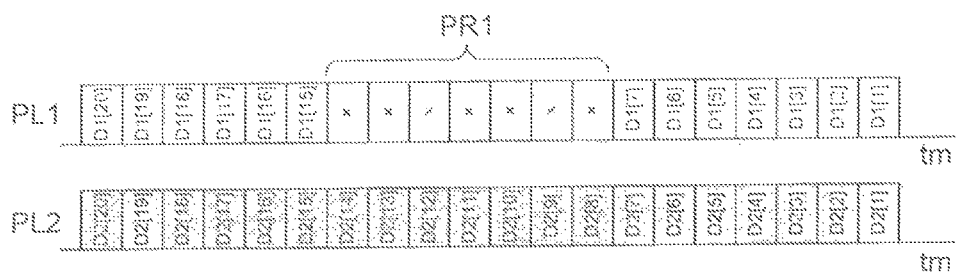
FIG. 3 is a schematic view illustrating the operations of the signal conversion device.
Figure 4:
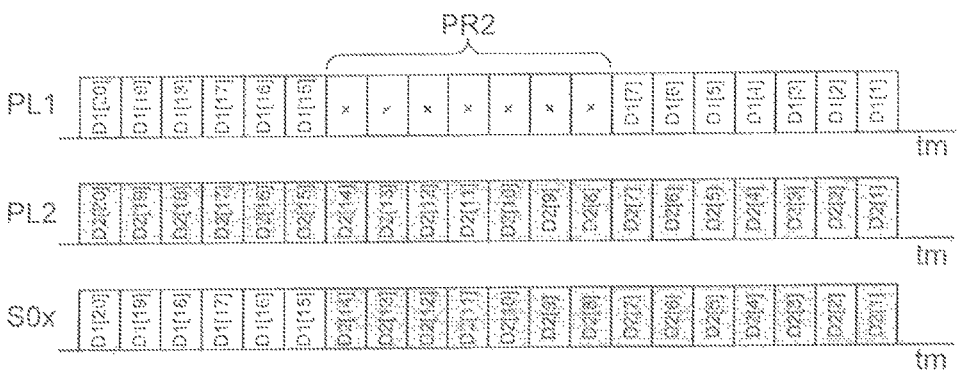
FIG. 4 is a schematic view illustrating the operations of the signal conversion device.
Figure 5:
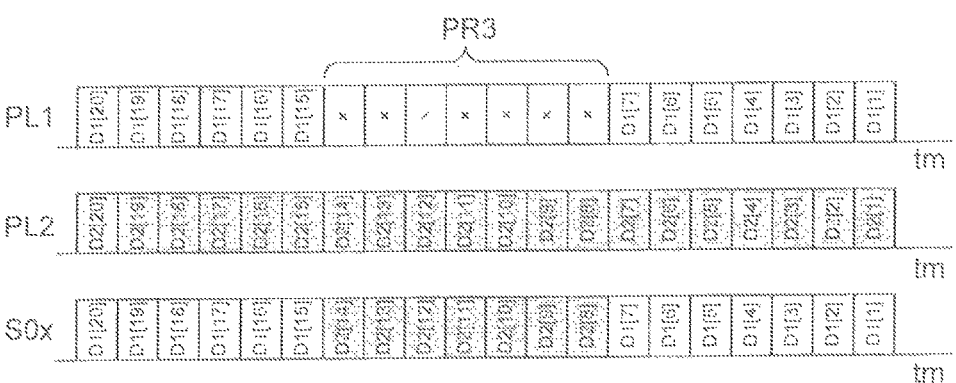
FIG. 5 is a schematic view illustrating the operations of the signal conversion device.

FIG. 3 to FIG. 5 are schematic views illustrating the operations of the signal conversion device.

These drawings show examples of parallel signals. In these drawings, the horizontal axis is a time tm. In these drawings, the parallel signals are output temporally in order from the right of the drawing. For simplification, the multiple signals corresponding to the parallel signals are not recited; and the multiple signals are recited collectively as "D1(1)" to "D1(20)," etc. First to twentieth data (signals) are illustrated in these drawings. The amount of the data (the signals) is arbitrary.

In the example of FIG. 3, invalidity is determined for an interval PR1 using the first status information ST1. In the interval PR1, at least one of the first clock signal CL1 or the first parallel signal PL1 is invalid. At this time, in the case where only the first serial-parallel converter 11 is used and the first clock signal CL1 and the first parallel signal PL1 are used, the correct parallel signal cannot be output during the interval PR1. Therefore, errors occur in bursts.

Conversely, in the first embodiment, the selection output part 40 uses the first status information ST1 and the second status information ST2 to select, and output, as the output parallel signal S0x, the data (the first parallel signal PL1 and the second parallel signal PL2) stored in the first buffer 21 and the second buffer 22. The output parallel signal S0x is a signal that is synchronized with the output clock signal CLx.

As shown in FIG. 4, it is determined that at least one of the first clock signal CL1 or the first parallel signal PL1 is invalid for an interval PR2 by using the first status information ST1. In the interval PR2 in the first embodiment, instead of the first parallel signal PL1 that is invalid, the valid second parallel signal PL2 is selected and output as the output parallel signal S0x. The first parallel signal PL1 that is invalid is prevented from being output as the output parallel signal S0x. The occurrence probability of burst errors can be reduced. In the example shown in FIG. 4, the output of the second parallel signal PL2 as the output parallel signal S0x is continued after the interval PR2.

For an interval PR3 as shown in FIG. 5, it is determined that at least one of the first clock signal CL1 or the first parallel signal PL1 is invalid by using the first status information ST1. For the interval PR3 in the example as well, the valid second parallel signal PL2 is selected and output as the output parallel signal S0x. Then, the first parallel signal PL1 is output as the output parallel signal S0x after the interval PR3.

In the embodiment, for example, the selection output part 40 outputs, as the output parallel signal S0x, a signal based on the first parallel signal PL1 stored in the first buffer 21 when the first information of the first status information ST1 includes information that the first clock signal CL1 is valid and the first parallel signal PL1 is valid. For example, the selection output part 40 may output, as the output parallel signal S0x, a signal based on the second parallel signal PL2 stored in the second buffer 22 when the second information of the second status information ST2 includes information that the second clock signal CL2 is valid and the second parallel signal PL2 is valid.

For example, when the selection output part 40 is outputting the signal based on the first parallel signal PL1 stored in the first buffer 21 as the output parallel signal S0x, the selection output part 40 may continue to output the signal based on the first parallel signal PL1 stored in the first buffer 21 as the output parallel signal S0x in the case where the first information includes information that the first clock signal CL1 is valid and the first parallel signal PL1 is valid.

Second Embodiment

Figure 6:
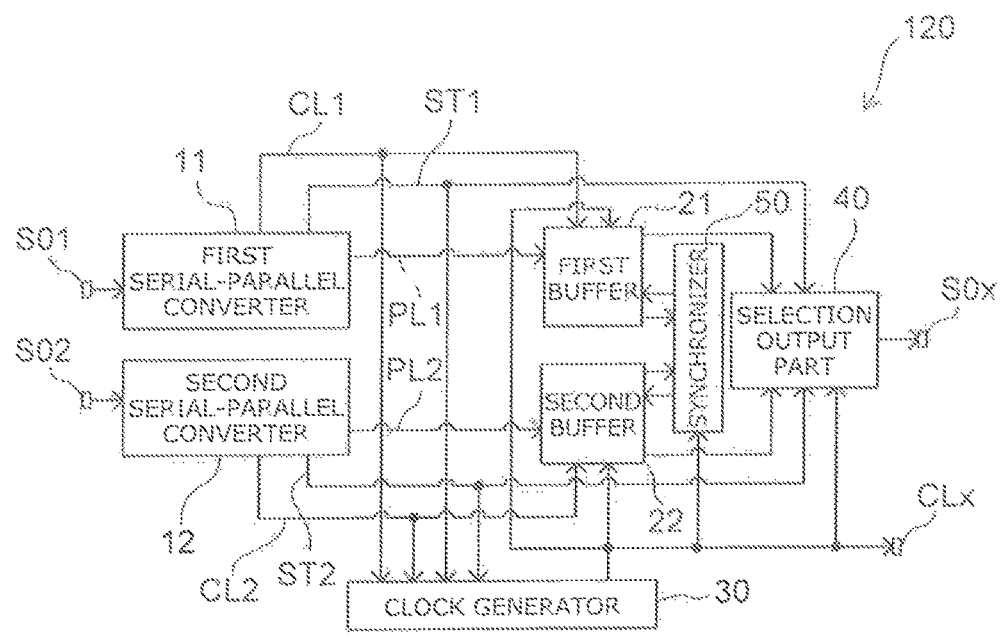
FIG. 6 is a schematic view illustrating a signal conversion device according to a second embodiment.

FIG. 6 is a schematic view illustrating a signal conversion device according to a second embodiment.

As shown in FIG. 6, the signal conversion device 120 according to the second embodiment further includes a synchronizer 50 in addition to the first serial-parallel converter 11, the second serial-parallel converter 12, the first buffer 21, the second buffer 22, the clock generator 30, and the selection output part 40. The first serial-parallel converter 11, the second serial-parallel converter 12, the first buffer 21, the second buffer 22, the clock generator 30, and the selection output part 40 are similar to the description relating to the first embodiment; and a description is therefore omitted. The synchronizer 50 may be provided in a circuit (including a semiconductor device) that is separate from the other components. Or, the synchronizer 50 may be provided in one circuit (including a semiconductor device) together with at least a portion of the other components. The synchronizer 50 may be a functionally-separated part.

The synchronizer 50 compares the first parallel signal PL1 stored in the first buffer 21 and the second parallel signal PL2 stored in the second buffer 22. The synchronizer 50 synchronizes. For example, the synchronizer 50 synchronizes according to the result of the comparison recited above. For example, the synchronizer 50 detects and corrects a shift by comparing the first parallel signal PL1 stored in the first buffer 21 and the second parallel signal PL2 stored in the second buffer 22.

The signal conversion device 120 also is, for example, a signal multiplexer. In the signal conversion device 120, the output of the valid parallel signal can be continued even in the case where there is a shift of the timing between the serial-parallel converters of the multiple systems (e.g., the two systems). For example, the occurrence probability of burst errors can be reduced. A signal conversion device can be provided in which more stable communication is possible.

An example of the shift of the timing will now be described.

Figure 7:
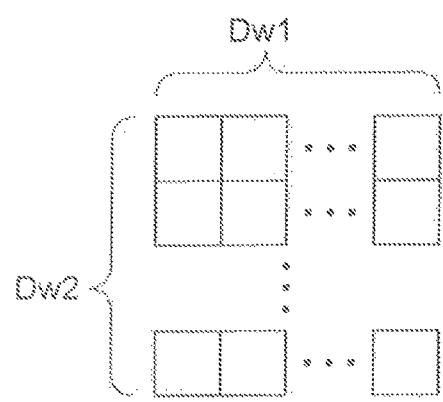
FIG. 7 is a schematic view illustrating a buffer.

FIG. 7 is a schematic view illustrating a buffer.

As shown in FIG. 7, the buffer that stores the parallel signal has a two-dimensional configuration. One dimension has a width DW1 (a length) that is the same as the width of the parallel signal. A width DW2 of the other dimension generally is expressed as the "depth." The number of the "depth" is expressed as "levels." For example, in the case where the "depth" is 2, this is expressed as a "buffer having two levels" or a "two-level buffer." More signals can be stored as the "depth" increases. One parallel signal is stored in a buffer having "a depth of one," i.e., a "one-level buffer."

FIG. 8 to FIG. 11 are schematic views illustrating storage states of signals of multiple buffers.

These drawings illustrate the storage states of the data (the parallel signals (the first parallel signal PL1 and the second parallel signal PL2)) of the first buffer 21 and the second buffer 22. In the following example, the parallel signals that continue as "XA," "XB," "XC," "XD," "XE," "XF," etc., are stored in the buffer. "XA," "XB," "XC," "XD," "XE," and "XF" each are signals including data having the prescribed width DW1.

Figure 8:
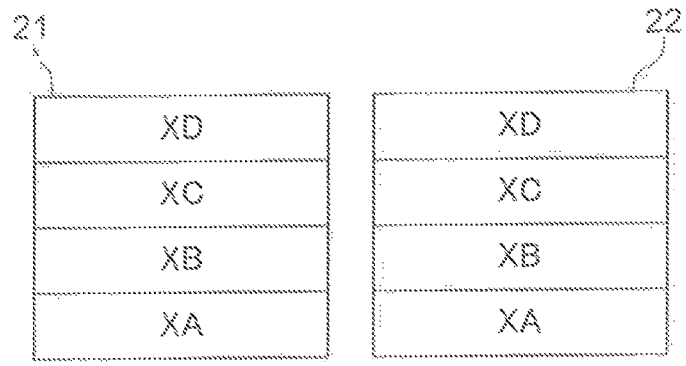
FIG. 8 is a schematic view illustrating storage states of signals of multiple buffers.

In the example shown in FIG. 8, the signals of "XA," "XB," "XC," and "XD" are written in order from the newest signal to the multiple buffers (e.g., the first buffer 21 and the second buffer 22).

Figure 9:
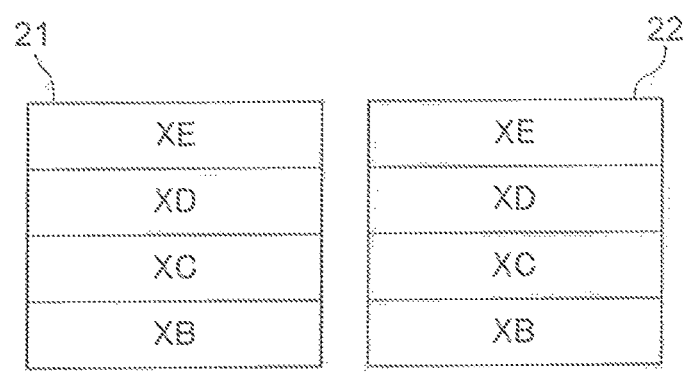
FIG. 9 is a schematic view illustrating storage states of signals of multiple buffers.

As shown in FIG. 9, when the next signal "XE" is input, the new signal "XE" is stored instead of the signal "XA" which is the oldest signal. Thus, the number of signals written corresponds to the number of levels.

There are cases where there is a temporal shift in the serial signals input to the serial-parallel converters. Or, there are cases where there is a frequency or phase shift of the clocks reconstructed by the serial-parallel converters. In such a case, a shift may occur in the timing of being output from the serial-parallel converter and stored in the buffer.

Figure 10:
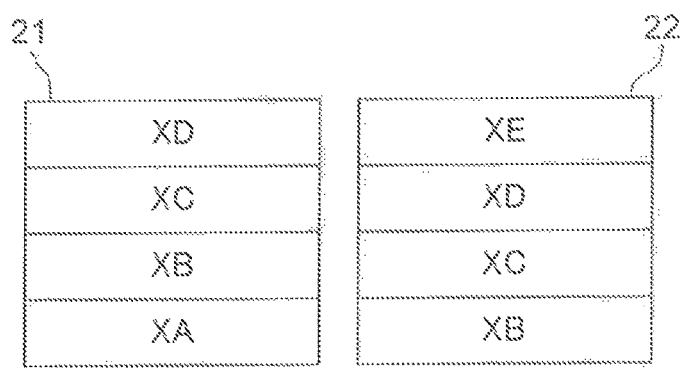
FIG. 10 is a schematic view illustrating storage states of signals of multiple buffers.
Figure 11:
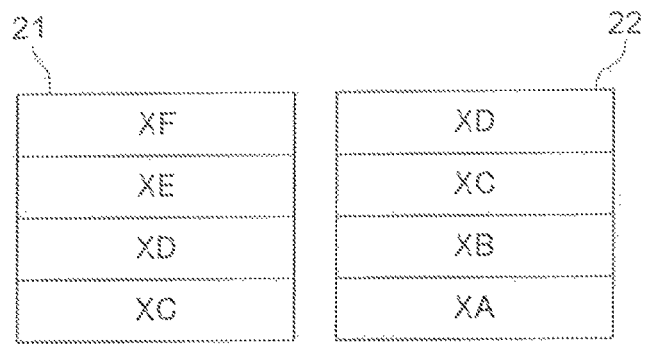
FIG. 11 is a schematic view illustrating storage states of signals of multiple buffers.

In such a case, for example, as shown in FIG. 10, a delay of one level may occur in the first buffer 21. Or, as shown in FIG. 11, a delay of two levels may occur in the second buffer 22. These delays cause "shifts." If the selection of the first parallel signal PL1 stored in the first buffer 21 or the second parallel signal PL2 stored in the second buffer 22 is performed when such a "shift" exists, for example, there are cases where the same signal is output multiple times. Or, there are cases where a portion of the signal is not output. Therefore, there is a possibility that the signal may not be output in the original order of "XA," "XB," "XC," "XD," "XE," and "XF."

Conversely, the synchronizer 50 performs a comparison of the first parallel signal PL1 stored in the first buffer 21 and the second parallel signal PL2 stored in the second buffer 22. The synchronizer 50 synchronizes based on the result of the comparison. For example, the signals (the first parallel signal PL1, the second parallel signal PL2, etc.) that are stored in the multiple buffers (the first buffer 21, the second buffer 22, etc.) are compared; and a common signal is found. Thereby, the "shift" is detected. When the selection output part 40 outputs the signal (the output parallel signal S0x), the synchronizer 50 corrects and outputs the "shift" to the selection output part 40. Thereby, the likelihood of the signal not being output in the original order can be suppressed.

For example, in the case where the second buffer 22 is selected after the signal "XB" of the first buffer 21 illustrated in FIG. 10 is output, the signal "XD" is undesirably output if not synchronous. In such a case, the signal "XC" is skipped.

Conversely, the synchronizer 50 detects that a "shift" of one unit has occurred. Then, when the second buffer 22 is selected, a control is performed to correct the signal (the data) corresponding to the "shift" of one unit and to output the signal "XC" of one previous.

By such a control, the valid parallel signal can be continued to be output in the case where there is a "shift" of the timing between the serial-parallel converters provided in the multiple systems (e.g., the two systems). Thereby, the occurrence probability of burst errors can be reduced further. A signal conversion device can be provided in which more stable communication is possible.

For example, in one buffer, the synchronicity is maintained easily even if the "shift" is large if the number of levels is high. Therefore, in the case where there is a possibility that the "shift" may become large. It is desirable to set the number of levels of the buffer to be large. On the other hand, the hardware can be simpler if the number of levels of the buffer is low. In the case where the "shift" does not become large, it is desirable to set the number of levels to be low. For example, it is desirable for the number of levels of the buffer to be about the same as the assumed size of the shift (the number of units of the shift). For example, in the case where substantially no shift occurs, the number of levels may be 1.

As described above, the output clock signal CLx is generated in the clock generator 30. As described above, in the case where the status information indicates that the output of the serial/parallel signal is invalid, there is a possibility that the clock signal that is output also is invalid. For example, in the case where one of the first clock signal CL1 or the second clock signal CL2 is used, there are cases where these clock signals temporarily become invalid. In the case where the clock signals are no longer valid, the output parallel signal that is output unfortunately cannot be recognized as the signal even if the output parallel signal is valid.

In the embodiment, the clock generator 30 can output the output clock signal CLx continuously and correctly by using the multiple status information (e.g., the first status information ST1, the second status information ST2, etc.) and the multiple clock signals (e.g., the first clock signal CL1, the second clock signal CL2, etc.).

Several examples of the clock generator 30 will now be described.

Figure 12:
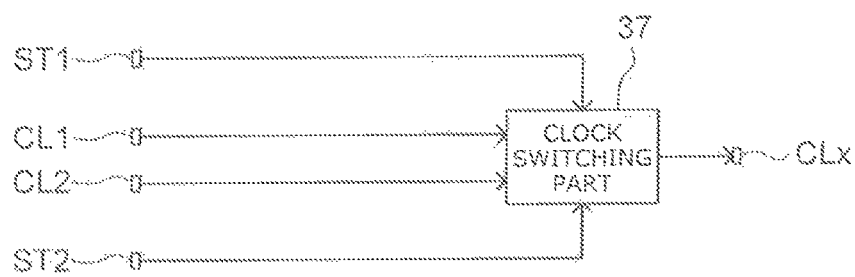
FIG. 12 is a schematic view showing an example of the clock generator.

FIG. 12 is a schematic view showing an example of the clock generator.

For example, a clock switching part 37 is provided in the clock generator 30 illustrated in FIG. 12. The multiple status information (the first status information ST1, the second status information ST2, etc.) and the multiple clock signals (the first clock signal CL1, the second clock signal CL2, etc.) are input to the clock switching part 37.

The clock switching part 37 switches and outputs one of the multiple clock signals (the first clock signal CL1, the second clock signal CL2, etc.) by using the multiple clock signals (the first clock signal CL1, the second clock signal CL2, etc.). For example, the validity of the clock signal of the first clock signal CL1 or the second clock signal CL2 is output as the output clock signal CLx. For example, the correct output clock signal CLx can be continued to be output even in the case where one of the multiple clock signals is no longer valid.

Thus, in the example shown in FIG. 12, the clock generator 30 outputs the first clock signal CL1 as the output clock signal CLx when the one parallel signal selected as the output parallel signal S0x recited above is the first parallel signal PL1 stored in the first buffer 21. On the other hand, the clock generator 30 outputs the second clock signal CL2 as the output clock signal CLx when the one parallel signal selected as the output parallel signal S0x recited above is the second parallel signal PL2 stored in the second buffer 22.

Figure 13:
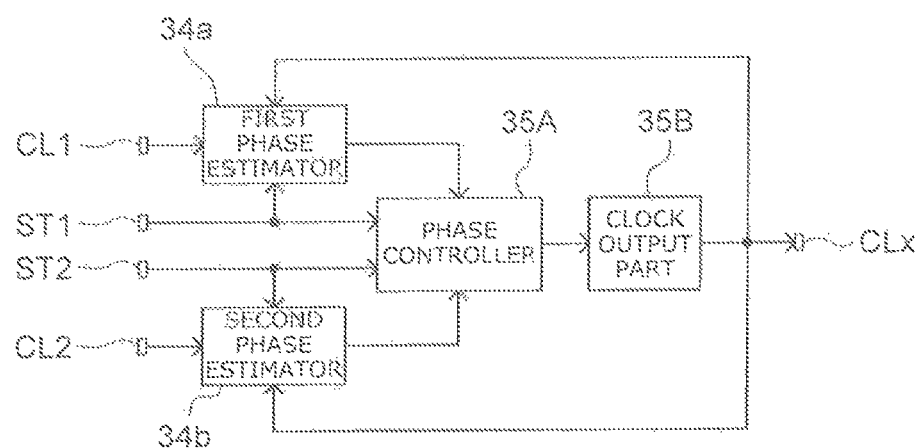
FIG. 13 is a schematic view showing another example of the clock generator.

FIG. 13 is a schematic view showing another example of the clock generator.

In the clock generator 30 illustrated in FIG. 13, a control is performed to match the phase of the output clock signal CLx to that of the valid clock signal of the multiple clock signals (the first clock signal CL1, the second clock signal CL2, etc.).

As shown in FIG. 13, a first phase estimator 34a, a second phase estimator 34b, a phase controller 35A, and a clock output part 35B are provided in the clock generator 30.

The output clock signal CLx, the first clock signal CL1, and the first status information ST1 are input to the first phase estimator 34a. The phase difference between the output clock signal CLx and the first clock signal CL1 is estimated in the first phase estimator 34a. The output clock signal CLx, the second clock signal CL2, and the second status information ST2 are input to the second phase estimator 34b. The phase difference between the output clock signal CLx and the second clock signal CL2 is estimated in the second phase estimator 34b. In the phase controller 35A, the phase of the clock signal (the output clock signal CLx) output from the clock output part 35B is changed (e.g., increased or reduced) by using the estimated values of these phase differences.

For example, in the case where the phase of the first clock signal CL1 has advanced compared to the phase of the output clock signal CLx, a control is performed to quicken the phase of the output clock signal CLx by increasing the phase of the output clock signal CLx output from the clock output part 35B. At this time, a control is performed using the estimated value of the phase corresponding to the valid clock signal by using the first status information ST1 and the second status information ST2. There are cases where, for example, the first status information ST1 indicates that the first clock signal CL1 is invalid; and the second status information ST2 indicates that the second clock signal CL2 is valid. In such a case, the control is performed using the estimated value from the second phase estimator 34b. Thereby, the correct clock (the output clock signal CLx) can be output continuously.

Thus, in the example shown in FIG. 13, when the one parallel signal selected as the output parallel signal S0x recited above is the first parallel signal PL1 stored in the first buffer 21, the phase of the output clock signal CLx generated by the clock generator 30 is synchronized with the phase of the first clock signal CL1. On the other hand, when the one parallel signal selected as the output parallel signal S0x recited above is the second parallel signal PL2 stored in the second buffer 22, the phase of the output clock signal CLx generated by the clock generator 30 is synchronized with the phase of the second clock signal CL2.

In the example of FIG. 13, the clock signal itself is not switched as in the example shown in FIG. 12. Therefore, for example, the clock jitter that accompanies the switching can be reduced. For example, the quality of the output clock signal CLx can be increased further.

Figure 14:
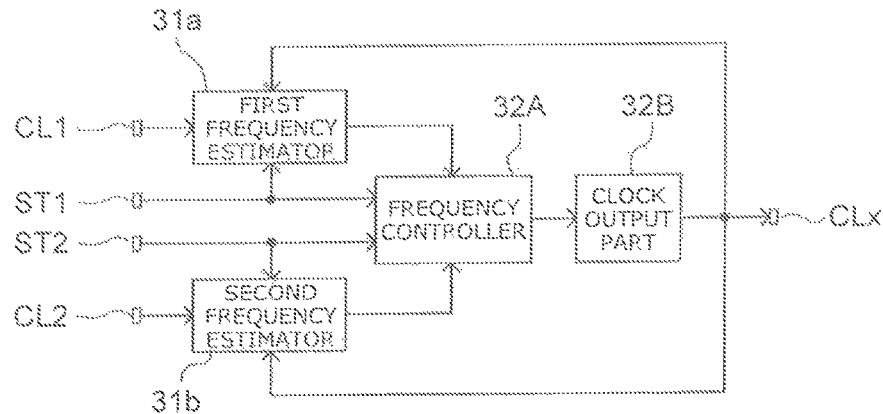
FIG. 14 is a schematic view showing another example of the clock generator.

FIG. 14 is a schematic view showing another example of the clock generator.

In the clock generator 30 illustrated in FIG. 14, a control is performed to match the frequency of the output clock signal CLx to that of the valid clock signal of the multiple clock signals (the first clock signal CL1, the second clock signal CL2, etc.).

As shown in FIG. 14, a first frequency estimator 31a, a second frequency estimator 31b, a frequency controller 32A, and a clock output part 32B are provided in the clock generator 30.

The output clock signal CLx, the first clock signal CL1, and the first status information ST1 are input to the first frequency estimator 31a. The difference of the frequencies between these clock signals is estimated in the first frequency estimator 31a. The output clock signal CLx, the second clock signal CL2, and the second status information ST2 are input to the second frequency estimator 31b. The difference of the frequencies between these clock signals is estimated in the second frequency estimator 31b. The frequency controller 32A changes (e.g., increases and reduces) the frequency of the output clock signal CLx output from the clock output part 32B by using easily the estimated values of the differences of these frequencies.

For example, in the case where the frequency of the first clock signal CL1 is high compared to that of the output clock signal CLx, a control is performed to increase the frequency of the output clock signal CLx. At this time, the control is performed using the estimated value of the frequency corresponding to the valid clock signal by using the first status information ST1 and the second status information ST2. For example, there are cases where the first status information ST1 indicates that the first clock signal CL1 is invalid, and the second status information ST2 indicates that the second clock signal CL2 is valid. At this time, the frequency is controlled using the estimated value from the second frequency estimator 31b. Thereby, the correct clock (the output clock signal CLx) can be output continuously.

Thus, in the example shown in FIG. 14, when the one parallel signal selected as the output parallel signal S0x recited above is the first parallel signal PL1 stored in the first buffer 21, the frequency of the output clock signal CLx generated by the clock generator 30 is synchronized with the frequency of the first clock signal CL1. On the other hand, when the one parallel signal selected as the output parallel signal S0x recited above is the second parallel signal PL2 stored in the second buffer 22, the frequency of the output clock signal CLx generated by the clock generator 30 is synchronized with the frequency of the second clock signal CL2.

For example, the likelihood is high that the difference of the frequencies between the first clock signal CL1 and the second clock signal CL2 is smaller than the difference of the phases between the first clock signal CL1 and the second clock signal CL2. This is because, for the same original serial signals, the frequencies match easily; but there are cases where the phases change due to the length of the transmission path, etc. It is considered that the difference (the shift) between the estimated value estimated by the first frequency estimator 31a and the estimated value estimated by the second frequency estimator 31b is smaller than the difference (the shift) between the value estimated by the first phase estimator 34a and the estimated value estimated by the second phase estimator 34b. Therefore, compared to the example of FIG. 12 or the example of FIG. 13, the increase of the clock jitter that occurs due to switching the clock can be reduced further in the example of FIG. 14.

In the embodiments recited above, the serial signals (e.g., the first serial signal S01 and the second serial signal S02) may be input from a wireless receiver.

Figure 15:
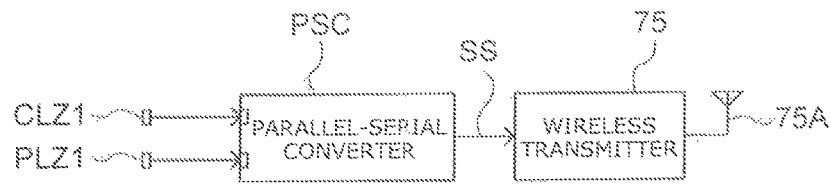
FIG. 15 is a schematic view showing an example of a serial signal.

FIG. 15 is a schematic view showing an example of a serial signal.

As shown in FIG. 15, the serial signal SS that is generated by the parallel-serial converter PSC may be transmitted to a wireless transmitter 75. The serial signal SS may be transmitted from the wireless transmitter 75 via an antenna 75A. The serial signal SS that is transmitted is received by a wireless receiver provided in the signal conversion device. The serial signal SS may be used as the first serial signal S01, the second serial signal S02, etc. In the wireless communication, modulation such as at least one of amplitude modulation, frequency modulation, or phase modulation may be performed.

Several examples of wireless receivers will now be described.

Figure 16:
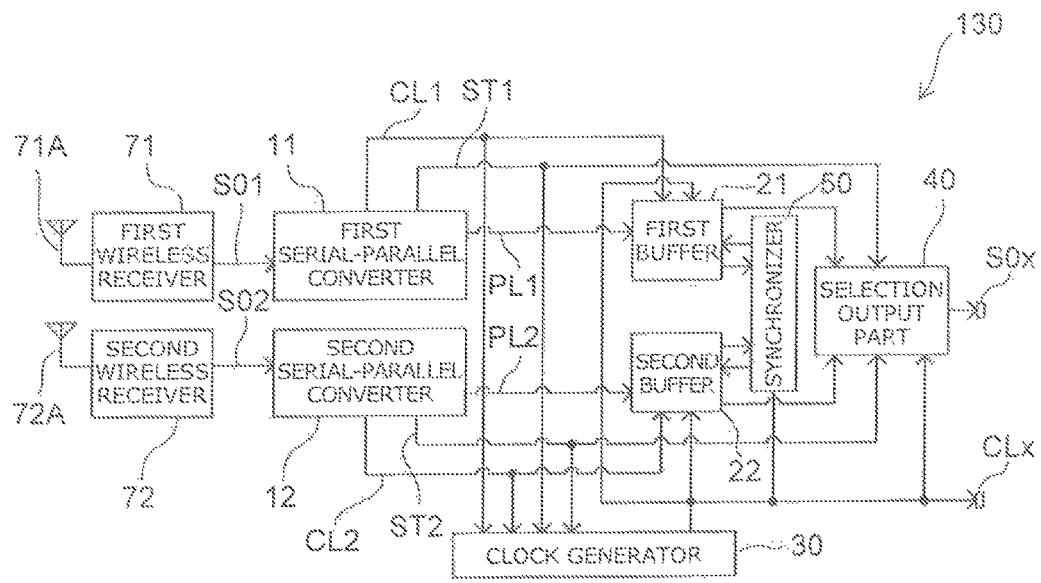
FIG. 16 is a schematic view illustrating another signal conversion device according to the embodiment.

FIG. 16 is a schematic view illustrating another signal conversion device according to the embodiment.

As shown in FIG. 16, a first wireless receiver 71, a second wireless receiver 72, a first antenna 71A, and a second antenna 72A are provided in the signal conversion device 130. Otherwise, the configuration is similar to that of the signal conversion device 120; and a description is therefore omitted.

The first antenna 71A is connected to the first wireless receiver 71. The output of the first wireless receiver 71 is supplied to the first serial-parallel converter 11 as the first serial signal S01.

The second antenna 72A is connected to the second wireless receiver 72. The output of the second wireless receiver 72 is supplied to the second serial-parallel converter 12 as the second serial signal S02.

Thus, the first serial signal S01 and the second serial signal S02 may be output from wireless receivers. The first serial signal S01 may be output from the first wireless receiver 71; and the second serial signal S02 may be output from the second wireless receiver 72. One wireless receiver may be provided to correspond to each of the multiple serial-parallel converters.

Compared to the case of transmitting the serial signal by wired communication, the signal may degrade easily in the case of transmitting by wireless communication due to degradation factors (e.g., fading, interference waves, etc.) accompanying wireless propagation. A valid signal can be selected and output more stably by providing one wireless receiver corresponding to each of the multiple serial-parallel converters.

Generally, the degradation that accompanies the propagation of wireless communication has a different tendency for each wireless receiver. Therefore, the likelihood of invalidity is high for multiple signals. For example, it is desirable to mount the multiple wireless receivers to be separated spatially. Thereby, for example, the tendencies of the degradation accompanying the propagation can be more different. The occurrence probability of burst errors can be reduced more effectively.

The effect of providing different tendencies of the degradation accompanying the propagation when spatially separating the multiple wireless receivers changes proportionally to the wavelength of the frequency used in the wireless communication. For example, the tendencies of the degradation accompanying the propagation can be more different by setting the frequency of the wireless communication to be high (e.g., a millimeter wave, etc.). By setting the frequency of the wireless communication to be high, high performance can be obtained using a smaller size.

Figure 17:
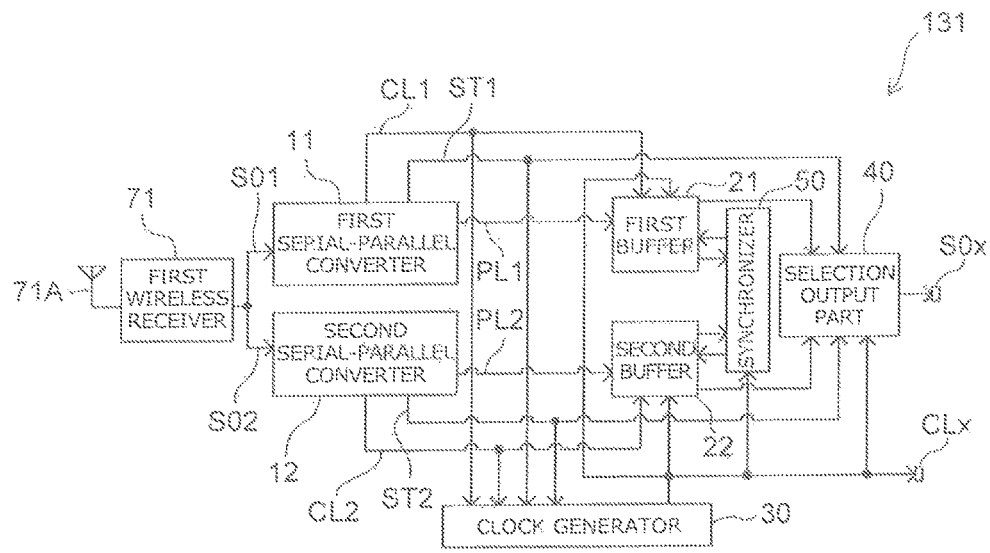
FIG. 17 is a schematic view illustrating another signal conversion device according to the embodiment.

FIG. 17 is a schematic view illustrating another signal conversion device according to the embodiment.

As shown in FIG. 17, the first wireless receiver 71 and the first antenna 71A are provided in the signal conversion device 131. Otherwise, the configuration is similar to that of the signal conversion device 120; and a description is therefore omitted.

One wireless receiver (the first wireless receiver 71) is provided in the signal conversion device 131. Then, the serial signal that is generated is branched into a plurality. For example, the first serial signal S01 is one of the multiple output signals of the branched output of the wireless receiver (the first wireless receiver 71). The second serial signal S02 is another one of the multiple output signals.

In the signal conversion device 131, it is considered that the tendencies of the degradation accompanying the wireless propagation are substantially the same between the first serial signal S01 and the second serial signal S02. However, for the first serial signal S01 and the second serial signal S02, the transmissions from the branching to the serial-parallel converters are different from each other; and the serial-parallel converters are different from each other. Thereby, differences occur between the intervals in which the signals become invalid. Thereby, a valid signal is output more easily even in the case where one of the multiple signals is no longer valid. The occurrence probability of burst errors can be reduced.

The configuration of the signal conversion device 131 is simpler than the configuration of the signal conversion device 130.

In the embodiment, the number of the serial-parallel converters may be three or more.

Figure 18:
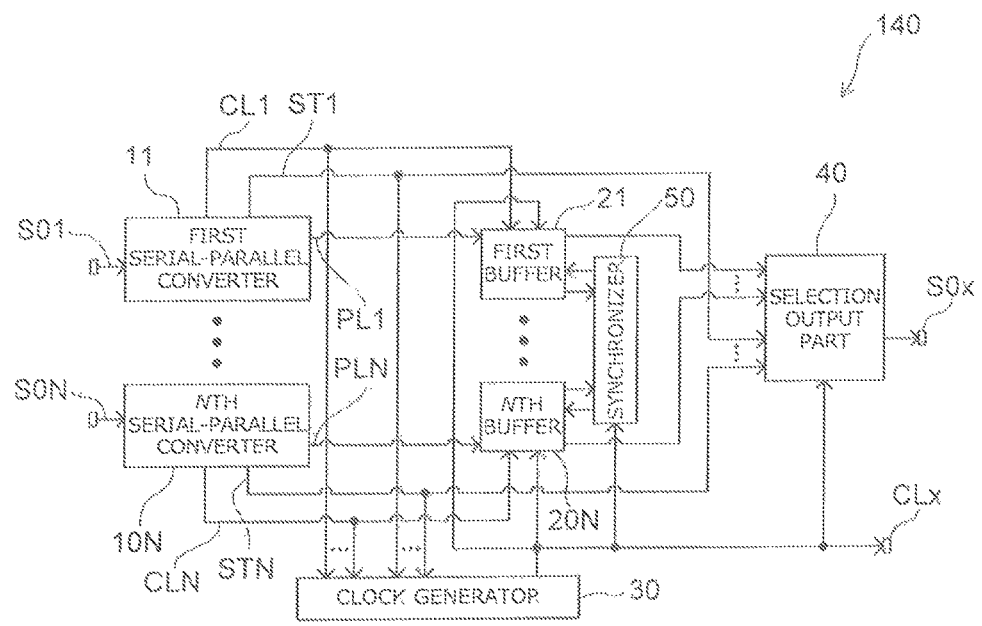
FIG. 18 is a schematic view illustrating another signal conversion device according to the embodiment.

FIG. 18 is a schematic view illustrating another signal conversion device according to the embodiment.

As shown in FIG. 18, the signal conversion device 140 includes multiple serial-parallel converters (the first to Nth serial-parallel converters 11 to 10N), multiple buffers (the first to Nth buffers 21 to 20N), the clock generator 30, and the selection output part 40. In the description, "N" is an integer of two or more.

Each of the multiple serial-parallel converters receives a serial signal (the first to Nth serial signals S01 to S0N), generates a clock signal (the first to Nth clock signals CL1 to CLN) synchronized with the serial signal, generates a parallel signal (the first to Nth parallel signals PL1 to PLN) by parallelizing the serial signal, and generates status information (the first to Nth status information ST1 to STN) including the information relating to at least one of the clock signal or the parallel signal.

The multiple buffers respectively store the parallel signals of the multiple serial-parallel converters.

The clock generator 30 generates the output clock signal CLx by using the clock signals of the multiple serial-parallel converters and the status information of the multiple serial-parallel converters.

The selection output part 40 outputs, as the output parallel signal S0x synchronized with the output clock signal CLx, a signal based on one parallel signal selected from the parallel signals of the multiple serial-parallel converters stored in the multiple buffers by using the status information of the multiple serial-parallel converters.

For example, the following is performed in the case where "N" is three or more. The third serial-parallel converter (the Nth serial-parallel converter 10N) and the third buffer (the Nth buffer 20N) are provided. The third serial-parallel converter receives the third serial signal (the Nth serial signal S0N), generates the third clock signal (the Nth clock signal CLN) synchronized with the third serial signal, generates the third parallel signal (the Nth parallel signal PLN) by parallelizing the third serial signal, and generates third status information (the Nth status information STN) including the third information relating to at least one of the third clock signal or the third parallel signal. The third buffer stores the third parallel signal.

The clock generator 30 generates the output clock signal CLx by further using the third clock signal and the third status information.

The selection output part 40 further uses the third status information to output, as the output parallel signal S0x synchronized with the output clock signal CLx, a signal based on one parallel signal of the first parallel signal stored in the first buffer, the second parallel signal stored in the second buffer, or the third parallel signal stored in the third buffer.

For example, by increasing the number of systems, the likelihood of all of the signals being invalid is low. The occurrence probability of burst errors can be reduced further. By increasing the number of systems, the performance can be increased further.

In the signal conversion device 140, the serial signals (the first to Nth serial signals S01 to S0N) may be received by wireless receivers.

Figure 19:
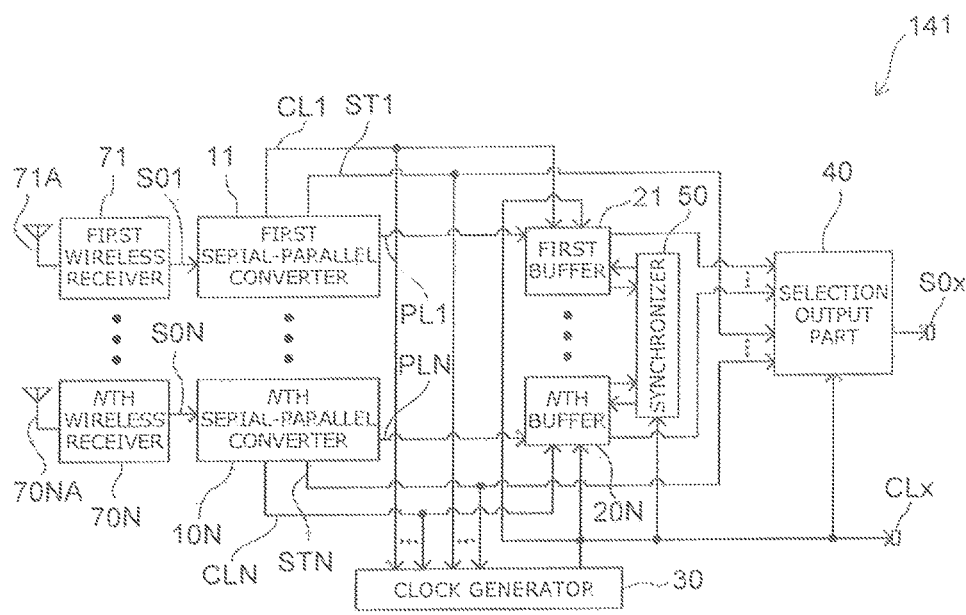
FIG. 19 is a schematic view illustrating another signal conversion device according to the embodiment.

FIG. 19 is a schematic view illustrating another signal conversion device according to the embodiment.

As shown in FIG. 19, multiple serial-parallel converters (the first to Nth serial-parallel converters 11 to 10N) and multiple wireless receivers (the first to Nth wireless receivers 71 to 70N) are provided in the signal conversion device 141. The first to Nth antennae 71A to 70NA are connected to the first to Nth wireless receivers 71 to 70N. The outputs (the serial signals) of the first to Nth wireless receivers 71 to 70N are supplied to the first to Nth serial-parallel converters 11 to 10N.

Thus, in the case where the number of the serial-parallel converters is three or more, wireless receivers may be provided respectively for the multiple serial-parallel converters.

Figure 20:
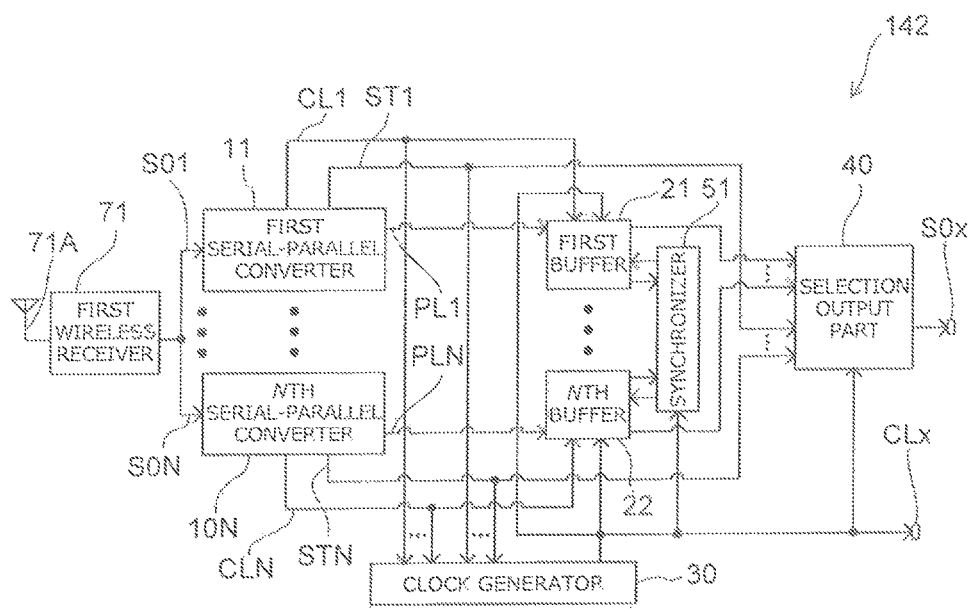
FIG. 20 is a schematic view illustrating another signal conversion device according to the embodiment.

FIG. 20 is a schematic view illustrating another signal conversion device according to the embodiment.

As shown in FIG. 20, multiple serial-parallel converters (the first to Nth serial-parallel converters 11 to 10N) and one wireless receiver (the first wireless receiver 71) are provided in the signal conversion device 142. The serial signal that is generated from the signal received by the first wireless receiver 71 is branched and input to the multiple serial-parallel converters. Thus, one of the multiple serial signals may be one of the multiple output signals branched from the output of the first wireless receiver 71. Another one of the multiple serial signals may be another one of the multiple output signals.

The synchronizer 50 may be omitted from the signal conversion devices 130, 131, and 140 to 142.

In the embodiments recited above, the multiple serial signals (e.g., the first serial signal S01, the second serial signal S02, etc.) may be, for example, the transmitted signal of a serial signal generated by multiplexing an image signal and a clock signal for the image signal. The multiple serial signals (e.g., the first serial signal S01, the second serial signal S02, etc.) may be, for example, the transmitted signal of a serial signal generated by multiplexing an image signal, a control signal, and a clock signal for the image signal.

The signal conversion devices according to the embodiments may include one or multiple circuits. The one or multiple circuits may be capable of implementing the functions of the first serial-parallel converter 11 recited above, the second serial-parallel converter 12 recited above, the first buffer 21 recited above, the second buffer 22 recited above, the clock generator 30 recited above, and the selection output part 40 recited above.

The embodiments relate to, for example, a method for converting a signal. The embodiments relate to, for example, a method for converting a serial signal into a parallel signal.

There is a method in which a parallel signal and a clock signal are multiplexed into a serial signal and transmitted; and the original parallel signal and clock signal are reconstructed and output by using the serial signal at the receiving side. Generally, such a conversion is called a serial-parallel conversion. In serial-parallel conversion, the original clock signal is reproduced from the received serial signal; and the serial signal is converted into a parallel signal and output by using the reproduced clock. In such a case, there are cases where the reproduction of the clock signal is not performed correctly; and the clock signal is no longer valid. Therefore, there are cases where the parallel signal can no longer be output correctly. Thereby, errors undesirably occur in bursts.

In the embodiments, for example, the occurrence probability of burst errors can be reduced even in the case where the serial-parallel conversion is in the state in which the signal of the clock cannot be performed correctly.

According to the embodiments, a signal conversion device can be provided in which stable communication is possible.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in signal conversion devices such as serial-parallel converters, buffers, clock generators, selection output parts, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all signal conversion devices practicable by an appropriate design modification by one skilled in the art based on the signal conversion devices described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A signal conversion device, comprising:
   a first serial-parallel converter receiving a first serial signal, generating a first clock signal synchronized with the first serial signal, generating a first parallel signal by parallelizing the first serial signal, and generating first status information including first information relating to at least one of the first clock signal or the first parallel signal;
   a second serial-parallel converter receiving a second serial signal, generating a second clock signal synchronized with the second serial signal, generating a second parallel signal by parallelizing the second serial signal, and generating second status information including second information relating to at least one of the second clock signal or the second parallel signal;
   a first buffer storing the first parallel signal;
   a second buffer storing the second parallel signal;
   a clock generator generating an output clock signal by using the first clock signal, the second clock signal, the first status information, and the second status information; and
   a selection output part using the first status information and the second status information to output, as an output parallel signal synchronized with the output clock signal, a signal based on one parallel signal of the first parallel signal stored in the first buffer or the second parallel signal stored in the second buffer.

2. The device according to claim 1, wherein
   the one parallel signal is the second parallel signal stored in the second buffer when the first information includes information that at least one of the first clock signal or the first parallel signal is invalid, and
   the one parallel signal is the first parallel signal stored in the first buffer when the second information includes information that at least one of the second clock signal or the second parallel signal is invalid.

3. The device according to claim 1, further comprising a synchronizer detecting and correcting a shift by comparing the first parallel signal stored in the first buffer and the second parallel signal stored in the second buffer.

4. The device according to claim 1, wherein
   a frequency of the output clock signal generated by the clock generator is synchronized with a frequency of the first clock signal when the one parallel signal is the first parallel signal stored in the first buffer, and
   the frequency of the output clock signal generated by the clock generator is synchronized with a frequency of the second clock signal when the one parallel signal is the second parallel signal stored in the second buffer.

5. The device according to claim 1 wherein
   a phase of the output clock signal generated by the clock generator is synchronized with a phase of the first clock signal when the one parallel signal is the first parallel signal stored in the first buffer, and
   the phase of the output clock signal generated by the clock generator is synchronized with a phase of the second clock signal when the one parallel signal is the second parallel signal stored in the second buffer.

6. The device according to claim 1, wherein
   the clock generator outputs the first clock signal as the output clock signal when the one parallel signal is the first parallel signal stored in the first buffer, and
   the clock generator outputs the second clock signal as the output clock signal when the one parallel signal is the second parallel signal stored in the second buffer.

7. The device according to claim 1, wherein the first serial signal and the second serial signal are output from a wireless receiver.

8. The device according to claim 7, further comprising the wireless receiver.

9. The device according to claim 1, wherein
   the first serial signal is output from a first wireless receiver, and
   the second serial signal is output from a second wireless receiver.

10. The device according to claim 9, further comprising the first wireless receiver and the second wireless receiver.

11. The device according to claim 1, wherein
    the first serial signal is one of a plurality of output signals,
    an output of a wireless receiver is branched into the output signals, and
    the second serial signal is another one of the output signals.

12. The device according to claim 11, further comprising the wireless receiver.

13. The device according to claim 1, wherein the second serial signal is the same as the first serial signal.

14. The device according to claim 1, wherein the selection output part outputs, as the output parallel signal, the signal based on the first parallel signal stored in the first buffer when the first information includes information that the first clock signal is valid and the first parallel signal is valid.

15. The device according to claim 1, wherein
    when the selection output part is outputting the signal based on the first parallel signal stored in the first buffer as the output parallel signal, the selection output part continues to output the signal based on the first parallel signal stored in the first buffer as the output parallel signal in the case where the first information includes information that the first clock signal is valid and the first parallel signal is valid.

16. A signal conversion device, comprising:
    a plurality of serial-parallel converters, each of the serial-parallel converters receiving a serial signal, generating a clock signal synchronized with the serial signal, generating a parallel signal by parallelizing the serial signal, and generating status information including information relating to at least one of the clock signal or the parallel signal;
    a plurality of buffers respectively storing the parallel signals of the serial-parallel converters;
    a clock generator generating an output clock signal by using the clock signals of the serial-parallel converters and the status information of the serial-parallel converters; and
    a selection output part using the status information of the serial-parallel converters to output, as an output parallel signal synchronized with the output clock signal, a signal based on one parallel signal selected from the parallel signals of the serial-parallel converters stored in the buffers.

17. A signal conversion device, comprising:
    a first serial-parallel converter receiving a first serial signal, generating a first clock signal synchronized with the first serial signal, generating a first parallel signal by parallelizing the first serial signal, and generating first status information including first information relating to at least one of the first clock signal or the first parallel signal;

a second serial-parallel converter receiving a second serial signal, generating a second clock signal synchronized with the second serial signal, generating a second parallel signal by parallelizing the second serial signal, and generating second status information including second information relating to at least one of the second clock signal or the second parallel signal;

a first buffer storing the first parallel signal;

a second buffer storing the second parallel signal;

a clock generator generating an output clock signal by using the first clock signal, the second clock signal, the first status information, and the second status information; and a selection output part using the first status information and the second status information to output, as an output parallel signal synchronized with the output clock signal, a signal based on one selected from the first parallel signal stored in the first buffer and the second parallel signal stored in the second buffer.

* * * * *